(12) United States Patent
Alvarez et al.

(10) Patent No.: US 10,350,713 B2
(45) Date of Patent: Jul. 16, 2019

(54) NO CLEAN FLUX COMPOSITION AND METHODS FOR USE THEREOF

(71) Applicant: International Business Machines Corporation, Armonk, NY (US)

(72) Inventors: Victor Alvarez, Haverstraw, NY (US); Pierre Y. Beaulieu, Granby (CA); Kang-Wook Lee, Yorktown Heights, NY (US); Jae-Woong Nah, Closter, NJ (US); Lavanya Turlapati, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/792,392

(22) Filed: Oct. 24, 2017

(65) Prior Publication Data
US 2018/0043478 A1  Feb. 15, 2018

Related U.S. Application Data

(62) Division of application No. 14/978,690, filed on Dec. 22, 2015.

(51) Int. Cl.
*B23K 35/00* (2006.01)
*B23K 35/36* (2006.01)
(Continued)

(52) U.S. Cl.
CPC .......... *B23K 35/3612* (2013.01); *B23K 1/008* (2013.01); *B23K 1/0016* (2013.01);
(Continued)

(58) Field of Classification Search
CPC ........ B23K 1/20; B23K 1/0016; B23K 1/008; B23K 1/203; B23K 1/206; B23K 2201/36; B23K 2201/40; B23K 35/0222
(Continued)

(56) References Cited

U.S. PATENT DOCUMENTS

| 5,443,660 A | 8/1995 | Gao et al. |
| 5,487,922 A | 1/1996 | Nieh et al. |

(Continued)

FOREIGN PATENT DOCUMENTS

JP   2000164631 A   6/2000

OTHER PUBLICATIONS

A. Horibe et al., "No Clean Flux technology for large die flip chip packages", 63rd Electronic Components and Technology Conference (ECTC), May 28-631, 2013 pp. 688-693.
(Continued)

*Primary Examiner* — Erin B Saad
(74) *Attorney, Agent, or Firm* — Scully, Scott, Murphy & Presser, P.C.; L. Jeffrey Kelly

(57) ABSTRACT

A flux formulation includes an activator and a protic solvent. The activator may be glutaric acid, levulinic acid, 2-ketobutyric acid, 2-oxovaleric acid, or mixtures thereof. Suitable protic solvents include alkanediol, alkoxy propanol and alkoxy ethanol. The flux formulation may be a no-clean flux formulation that may be used in the soldering of electronic circuit board assemblies, for example, in conjunction with a support fixture having a planar back surface that minimizes vibrations during processing that might otherwise cause misalignment between a chip and a substrate prior to solder reflow.

14 Claims, 4 Drawing Sheets

(51) Int. Cl.
*B23K 1/00* (2006.01)
*B23K 35/362* (2006.01)
*H01L 21/56* (2006.01)
*H01L 23/00* (2006.01)
*B23K 1/008* (2006.01)
*B23K 1/012* (2006.01)

(52) U.S. Cl.
CPC ............ *B23K 1/012* (2013.01); *B23K 35/362* (2013.01); *H01L 21/563* (2013.01); *H01L 24/81* (2013.01); *H01L 2224/16227* (2013.01); *H01L 2224/16238* (2013.01); *H01L 2224/81009* (2013.01); *H01L 2224/81024* (2013.01); *H01L 2224/81191* (2013.01); *H01L 2224/81193* (2013.01); *H01L 2224/81801* (2013.01); *H01L 2924/06* (2013.01); *H01L 2924/20104* (2013.01); *H01L 2924/20105* (2013.01); *H01L 2924/20106* (2013.01); *H01L 2924/20107* (2013.01)

(58) Field of Classification Search
USPC ........... 228/116, 178, 18, 205, 206, 223, 5.1
See application file for complete search history.

(56) References Cited

U.S. PATENT DOCUMENTS

| | | |
|---|---|---|
| 6,059,894 A | 5/2000 | Master et al. |
| 6,103,549 A | 8/2000 | Master et al. |
| 6,217,671 B1 | 4/2001 | Henderson et al. |
| 6,337,509 B2 | 1/2002 | Cokely et al. |
| 6,617,195 B1 | 9/2003 | Pendse |
| 6,713,318 B2 | 3/2004 | Maeda et al. |
| 7,740,713 B2 | 6/2010 | Duchesne et al. |
| 7,780,801 B2 | 8/2010 | Duchesne et al. |
| 2004/0000355 A1 | 1/2004 | Suga et al. |
| 2004/0007610 A1 | 1/2004 | Suga et al. |
| 2004/0084510 A1 | 5/2004 | Wetz et al. |
| 2004/0118697 A1 | 6/2004 | Wen+ et al. |
| 2005/0082670 A1 | 4/2005 | Quinones et al. |
| 2005/0241731 A1 | 11/2005 | Duchesne et al. |
| 2010/0175790 A1 | 7/2010 | Duchesne et al. |
| 2015/0091162 A1 | 4/2015 | Murayama |

OTHER PUBLICATIONS

S. Lim et al., "Ultralow residue (ULR) semiconductor grade fluxes for copper pillar flip-chip", 36th International Electronics Manufacturing Technology Conference (IEMT), 2014, 4 pages.

XTRAK plasma treatment system; http://www.nordson.com/en/divisions/march/products/legacy-products/xtrak-plasmatreatment-system/ 2016.

List of IBM Patents or Patent Applications Treated as Related Dated Oct. 24, 2017, 2 Pages.

U.S. Office Action dated Dec. 26, 2017 received in a related U.S. Patent Application, namely U.S. Appl. No. 14/978,690.

NO CLEAN FLUX COMPOSITION AND METHODS FOR USE THEREOF

BACKGROUND

The present application relates generally to the manufacture of microelectronic components, and more specifically to no clean flux compositions and methods for soldering, such as in the assembly of integrated circuit modules and integrated circuit boards.

During the manufacture of microelectronic components, electrical connections are made, for example, between a single or multiple chips and a substrate. In an example manufacturing process, a chip is soldered directly to a substrate such as a laminate. In such manufacturing processes, a soldering flux is typically used to help fuse the elements being electrically connected. The soldering flux reacts with and eliminates surface oxides or impurities and protects the surfaces being soldered against further oxidation during soldering. The soldering flux may also improve wettability of the solder.

In a soldering process, solder bumps or metal pads on respective components to be joined are aligned and temporarily held in place with a tacky soldering flux. During the subsequent reflow process, the assembly is heated to melt the solder and form metallurgical bonds and electrical connections. To improve reliability, an underfill material can be used to fill the gap between the soldered components. The underfill material decreases the impact of thermal stresses that may otherwise compromise the solder joint and/or fragile materials that are present within one of the components, such as low-k dielectric materials that are used within a chip.

Fluxes in use by the microelectronics industry for automated soldering of printed circuit assemblies typically contain corrosive organic acids or components that, upon heating and dissipation of the flux, leave a decomposition residue that if un-cleaned will adversely impact adhesion of the underfill material to one or both of the components being joined and may also negatively impact the electrical contact resistance across the solder joint. Effective removal of such residue can be challenging in view of the narrow gap dimensions between the soldered components. Moreover, a step of residue removal adds time and expense to the soldering process.

In view of the foregoing, it would be advantageous to provide a no clean flux composition that does not require a cleaning process to remove flux residue from the device after reflow.

SUMMARY

In accordance with embodiments of the present application, a flux formulation includes an activator and a protic solvent. The activator can be a diacid or a keto acid having a boiling, sublimation or decomposition point of from 150° C. to 260° C. Example activators include glutaric acid, levulinic acid, 2-ketobutyric acid, 2-oxovaleric acid, or mixtures thereof. Suitable protic solvents include alkanediol, alkoxy propanol and alkoxy ethanol. In embodiments, the flux formulation is a no-clean flux formulation that may be used in the soldering of electronic circuit board assemblies. An example flux formulation includes 5-15 wt. % activator such as a diacid or keto acid, and 85-95 wt. % protic solvent.

A soldering method involves applying the flux formulation to a surface of a first substrate to be soldered. The first substrate may include a plurality of solder bumps or metal contacts. The solder bumps or metal contacts are then placed in contact with solder bumps formed on a surface of a second substrate and heated to melt the solder bumps and solder the first substrate to the second substrate.

The first and second substrates may be a laminate substrate and a chip, for example. Further, to facilitate transport of the first and second substrates, for example into and out of a soldering furnace, the first and second substrates may be placed on a fixture such as a tray that supports the chip-substrate assembly. In embodiments, the fixture is an aluminum tray having a planar backside surface. The planar backside surface is configured to maintain good thermomechanical contact with a moving belt that carries the fixture and parts to be soldered through a soldering furnace. Such good contact maintains the alignment of the chip to the substrate by minimizing the vibration of the chip-substrate assembly. The fixture enables the use of less viscous and tacky no clean fluxes than conventional water-soluble fluxes.

In embodiments, the disclosed flux formulation is a no clean flux formulation that may be incorporated into a soldering method involving chips that contain low-k dielectric materials. The no clean flux formulation enables an in-line underfill process that minimizes thermally-induced stresses and facilitates use of the low-k dielectric materials.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
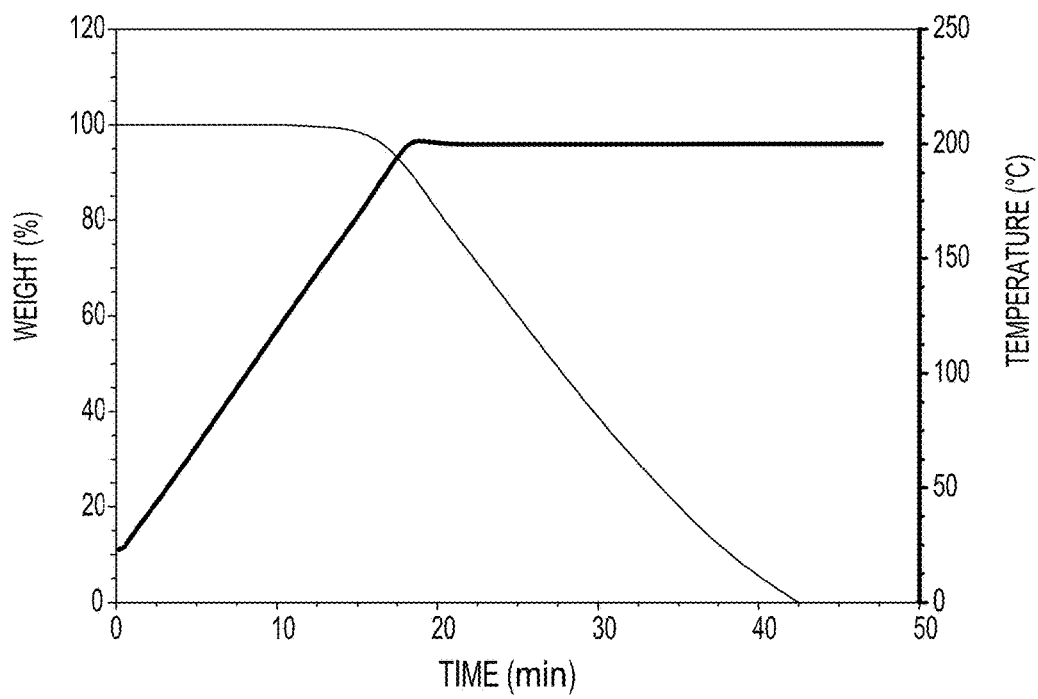
FIG. 1 is a thermo gravimetric analysis (TGA) scan for glutaric acid.

Reference will now be made in greater detail to various embodiments of the subject matter of the present application, some embodiments of which are illustrated in the accompanying drawings. The same reference numerals will be used throughout the drawings to refer to the same or similar parts.

According to various embodiments, a flux formulation comprises an activator and a protic solvent. The activator may comprise an organic acid such as a diacid or a keto acid. Diacids contain two carboxylic acid groups. Keto acids or ketoacids (also called oxo acids or oxoacids) are organic compounds that contain a carboxylic acid group and a ketone group. Exemplary organic acids include glutaric acid, levulinic acid, 2-ketobutyric acid, 2-oxovaleric acid, or mixtures thereof. A thermo gravimetric analysis (TGA) scan for glutaric acid is shown in FIG. 1. Initial decomposition of glutaric acid is seen at about 150° C. The activator is effective to remove oxides present from the surfaces to be soldered and improve wetting of a solder thereto.

A protic solvent includes an acidic hydrogen atom and can act as a proton ($H^+$) donor. In various embodiments a protic solvent includes a hydrogen atom bound to an oxygen atom, as in a hydroxyl group. Example protic solvents include alkanediols, alkoxy propanols, alkoxy ethanols, or mixtures thereof. Examples of alkanediols include 1,2-propanediol, 1,3-propanediol, 1,2-butanediol, 1,3-butanediol, 1,4-butanediol, 3-methyl-1,3-butanediol, 1,5-pentanediol, 3-methyl-1, 5-pentanediol, 1,2-hexanediol, 1,6-hexanediol, and 2-ethyl-1,3-hexanediol. Examples of alkoxy propanols include 1-propoxy-2-propanol, propylene glycol n-butyl ether, di(propylene glycol) methyl ether, di(propylene glycol) propyl ether. Examples of alkoxy ethanols include 2-butoxy ethanol and 2-proxy ethanol. In various embodiments, the flux formulation is a solution of an organic acid dissolved in a protic solvent.

An example flux formulation comprises 5-15 wt. % (e.g., 5, 10 or 15 wt. %) activator and 85-95 wt. % (e.g., 85, 90 or 95 wt. %) protic solvent. A further example flux formulation consists essentially of 5-15 wt. % diacid or keto acid and 85-95 wt. % protic solvent. According to embodiments, the flux formulation does not include water and is free of amine compounds. In particular, amine compounds typically form non-volatile salts and are excluded from the disclosed flux formulations. Further, the flux formulation according to embodiments does not include halides or organic resins.

Each of the activator and the solvent has a boiling, sublimation or decomposition point in the range of 150° C. to 260° C. such that both components substantially or completely evaporate or sublime during solder reflow and are not present after reflow. The disclosed flux formulations remain tacky after application, and are adapted to hold an aligned chip in position on a substrate prior to solder reflow. The tackiness of the disclosed flux formulations may range from 20 to 120 gram-force (gf) at 23° C., e.g., 20, 40, 60, 80, 100 or 120 gf, including ranges between any of the foregoing values. In embodiments, the activator and the solvent dissipate completely when heated to a reflow temperature of 150° C. or above (e.g., 260° C.).

The substrate may comprise a semiconductor material such as silicon. Alternatively, the substrate may comprise an insulating material such as a glass and/or a polymer. For example, the substrate may be a printed circuit board and comprise a glass epoxy. The substrate may include bond pad metallization structures, which can comprise Ni, Au, Cr, Cu, Ti, W, as well as combinations and alloys thereof.

The chip may comprise logic or memory functionality, for example. In embodiments, the chip comprises a low-k dielectric material. As used herein, a low-k dielectric material has a dielectric constant less than that of silicon oxide. For advanced node chips, decreasing the dielectric constant in the wiring layers is important for high-speed data transmission.

Though the incorporation of low-k dielectric materials into semiconductor device structures can provide a significant increase in device performance, the porous nature of low-k dielectric materials typically results in poor mechanical strength compared to traditional dielectric films such as silicon oxide, which results in low overall toughness and poor adhesion attributes. These attributes lead to a challenging set of mechanical issues during the packaging of chips that contain low-k dielectrics.

In particular, the coefficient of thermal expansion (CTE) mismatch between the silicon-based chip and the organic substrate (laminate) produces thermomechanical stresses that can lead to solder bump fatigue, delamination of the low-k dielectric materials, and even the failure of the electronic package. The chip may also include solder bumps for soldering the chip to the metallization structures of the substrate.

The solder bumps may comprise lead (Pb) or, in embodiments, a lead-free solder may be used. Example Pb-free solder compositions include tin-based solders such as tin-copper alloys. Tin-copper solders may include trace amounts of silver, for example. The eutectic temperature for the binary tin-copper system is about 228° C.

Flip-chip assembly onto substrates using solder is typically performed by spraying or brushing a flux formulation onto the substrate. A flux can also be applied by dipping a chip into the flux. Flux formulations desirably possess a number of characteristics, including suitable rheology, solderability, and their compatibility with molded or capillary underfill materials. The viscosity of the flux formulation, for example, should be high enough to avoid wicking and contamination of the chip, but low enough to be uniformly applied to the chip or substrate. An additional characteristic of a flux formulation is its ability to retain the flipped chip in position during reflow.

Figure 2:
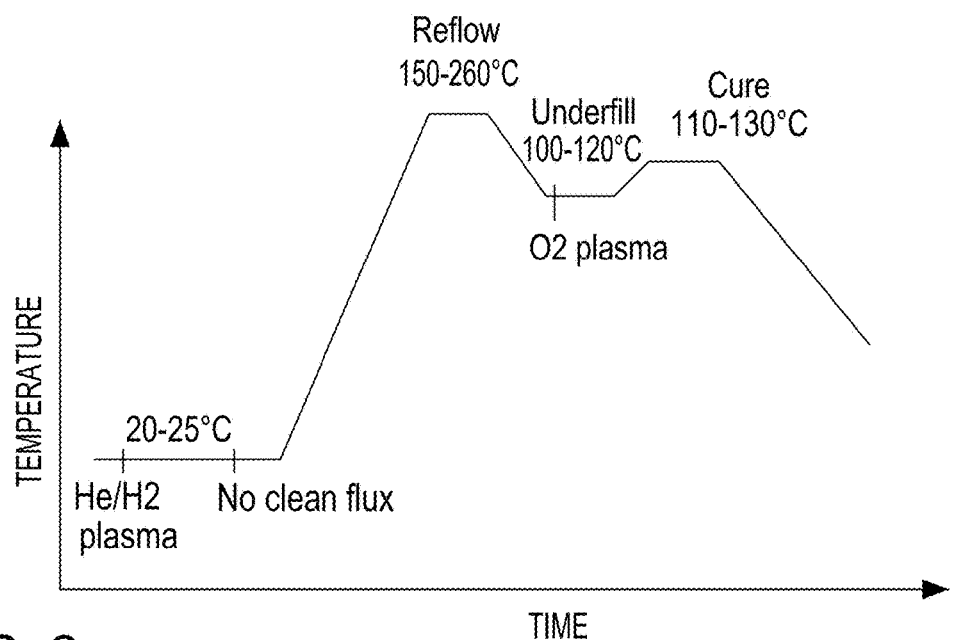
FIG. 2 is a schematic diagram of no clean flux soldering method according to embodiments.

The principle function of a flux is to promote solderability (wettability) between two surfaces. During the soldering operation, after applying the flux formulation to the substrate, the chip and the substrate are aligned, brought into contact, and joined by heating the assembly to a temperature above the melting point (liquidus temperature) of the solder (i.e., solder reflow). In operation, the assembly may be conveyed over or through a pre-heater to evaporate the solvent and activate the flux, and then conveyed into a furnace such as a convection furnace to affect melting of the solder. In operation, the furnace may comprise a circulated, heated gas such as nitrogen ($N_2$) gas. The thermal profile of an example reflow solder process is depicted in FIG. 2. The illustrated process includes multiple stages, i.e., pre-heat, thermal soak, reflow, in-line underfill, curing and cooling.

During the pre-heat, the temperature of the assembly is increased, typically at a heating rate of 1-3° C./sec to minimize thermal shock and avoid cracking. During the pre-heat, solvent from the flux formulation begins to evaporate.

Optionally, as also shown schematically in FIG. 2, prior to the pre-heat components of the assembly can be exposed to a surface-cleaning reducing plasma treatment. A reducing plasma may comprise, for example a mixture of hydrogen with helium or argon or mixtures thereof. Hydrogen is used as a reducing agent. An example reducing gas composition includes 1-5% hydrogen, with the balance being an inert carrier gas. In embodiments, the plasma treatment is performed at atmospheric pressure, which allows surfaces to be treated continuously. In operation, according to embodiments, a workpiece (chip or substrate) is conveyed proximate to a plasma head in open air where the reducing plasma can reduce surface tin oxides of tin-based solders, for example.

Following the pre-heat, a thermal soak of typically 5 to 120 seconds may be used to remove volatile components and activate the flux. During the thermal soak, the activator begins to reduce oxides that are present on metal pads and solder balls. A thermal soak temperature of 100° C. to 200°

C. may be used. Too high a temperature may lead to solder spattering or oxidation, while the flux formulation may not adequately activate if the temperature is too low. The thermal soak can also minimize temperature gradients across the assembly and, in embodiments, establish a thermal equilibrium between the chip, solder and substrate prior to solder reflow.

During the soak, the flux reacts with and dissipates metal oxides and optionally other contaminants present on the metal surfaces to be joined to produce clean metal surfaces. This allows for the formation of intermetallic compounds that create a strong bond between the solder and the adjacent metal. In embodiments, evaporation of the solvent and dissipation of metal oxides leaves no residue on the substrate or on the chip.

During solder reflow, the maximum temperature of the process is reached. A common reflow temperature is 20° C. to 40° C. above the liquidus temperature of the solder. A reflow time (e.g., time at temperature) may range from 5 to 90 seconds. The term "reflow" is used to refer to a process where the solder undergoes a solid-to-liquid phase transformation (as opposed to merely softening). During reflow, the flux decreases surface tension at the interface between the solder and the metallization structures, which facilitates metallurgical bonding when the solder melts. Too high a reflow temperature or too much time at temperature may induce damage to the chip or substrate, while too low a reflow temperature or too little time at temperature may result in trapped solvent or flux, or the formation of cold joints or voids.

After solder reflow, the assembly is gradually cooled to solidify the solder joints. Proper cooling minimizes excess intermetallic formation and thermal shock to the components. The cooling rate may range from 5 to 10° C./second.

In order to minimize the stress across solder joints, and as explained in further detail below, an underfill material may be introduced to the chip-substrate assembly during cooling of the assembly. Application of an underfill material may be performed at 100 to 120° C., e.g., 110° C. Underfilling may be performed in-line, i.e., during the cooling cycle from the reflow temperature without cooling the assembly to below 100° C. until after the underfill is added.

In embodiments, a flip-chip assembly is formed by soldering the solder bumps of an integrated circuit chip to the appropriate metal bond sites of a substrate. The reflow soldering operation typically leaves a gap of 0.02 mm to 0.2 mm between the chip and the substrate. The gap may be filled with an underfill material, which in embodiments may be dispensed around the periphery of the soldered structure and allowed to flow between the chip and the substrate by capillary action.

The underfill material is adapted to relieve thermomechanical stresses on the solder interconnections that arise due to the difference in coefficients of thermal expansion (CTE) between the silicon-based chip (CTE~$2.5 \times 10^{-6}$/° C.) and the organic substrate (CTE~$15$-$20 \times 10^{-6}$/° C.). The use of lead-free solders, which are harder than lead-containing solders, exacerbates the build up of such thermomechanical stresses.

As seen also with reference to FIG. 2, prior to applying the underfill material, exposed surfaces within the gap may be treated with an oxidizing plasma. The oxidizing plasma may eliminate flux residue, and otherwise promote good adhesion of the underfill material.

After its application the underfill material may be partially or fully cured within a temperature range of from greater than 100° C. to 130° C., e.g., 120° C. In embodiments, the temperature of the chip-substrate assembly is maintained above 100° C. between the reflow and underfill cure. After solder reflow, the underfill material may be fully cured in a separate process if desired. In addition to minimizing process-induced temperature gradients, this approach decreases total process time.

Typical underfill materials include epoxy resins, curing agents and inorganic fillers that form a cross-linked thermosetting polymer when cured. The properties of the cured polymer, such as the CTE and elastic modulus, decrease the thermomechanical stress on the solder joints and alleviate stresses that would otherwise be transferred into the IC chip.

Once cured, the underfill acts as a buffer between the chip and the substrate and functions to distribute the CTE-induced stress over the entire or substantially entire interfacial surface of the chip. Underfill materials also protect the interconnects from moisture and other forms of contamination.

Figure 3A:
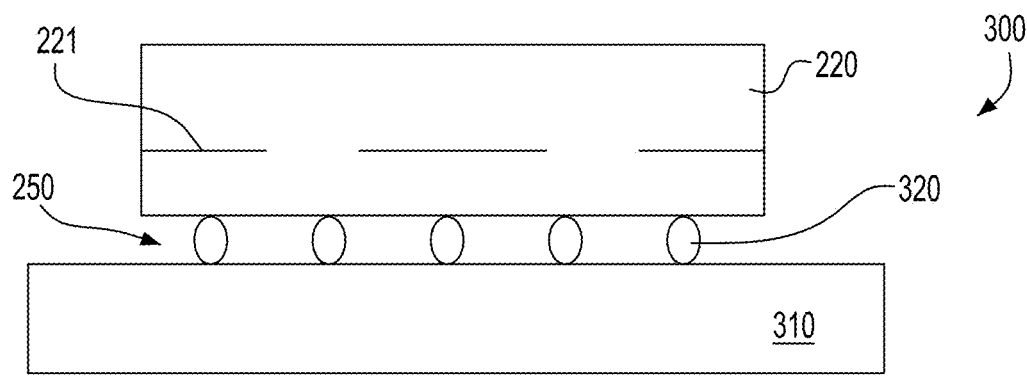
FIG. 3A is a cross-sectional schematic view of a semiconductor package at a preliminary stage of packaging.

According to various embodiments, FIG. 3A is schematic cutaway view of a semiconductor package 300 at an initial stage of packaging. Initially, a flux formulation is applied to a chip side of substrate 310. The flux formulation may be applied by spray coating, for example, to metal pads (not shown) formed on the substrate.

Chip 220 including a low-k dielectric layer 221 is attached to the substrate 310 by reflowing solder associated with a plurality of solder balls 320 that may be formed in an array on the chip 220. A corresponding array of metal pads is disposed on the substrate 310 so that when the solder balls 320 are reflowed, the solder bonds to the pads of the substrate 310, thereby electrically connecting the solder balls 320 to the pads. During reflow soldering, the chip and substrate are heated until the solder balls 320 are in a liquid state.

After the chip 220 is electrically attached to the substrate 310, a gap 250 is formed between adjacent surfaces of the chip 220 and the substrate 310. Though the solder balls 320 bridge the gap 250, the gap 250 is not total filled.

Interlayer dielectrics such as low-k dielectric layer 221 that are incorporated into the chip 220 are subject to cracking if excess stress is exerted on the chip 220. A capillary underfill 350, however, generally minimizes the force exerted on the chip 220 and therefore minimizes the risk of stress-induced cracking within the chip 220. Underfill 350 can be applied using several methods known to those skilled in the art.

Figure 3B:
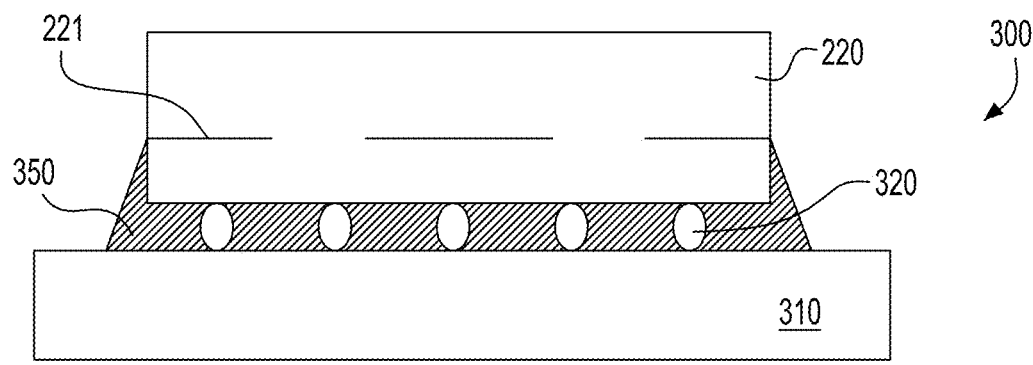
FIG. 3B is a cross-sectional schematic view of a semiconductor package after underfill is incorporated between the chip and the substrate.

FIG. 3B is schematic cutaway view of a semiconductor package 300 after a capillary underfill 350 has been placed between the chip 220 and the substrate 310. Underfill 350 effectively strengthens the bonded chip 220 by distributing the forces exerted on the chip via the reflowed solder over a larger area.

Figures 4, 5A:
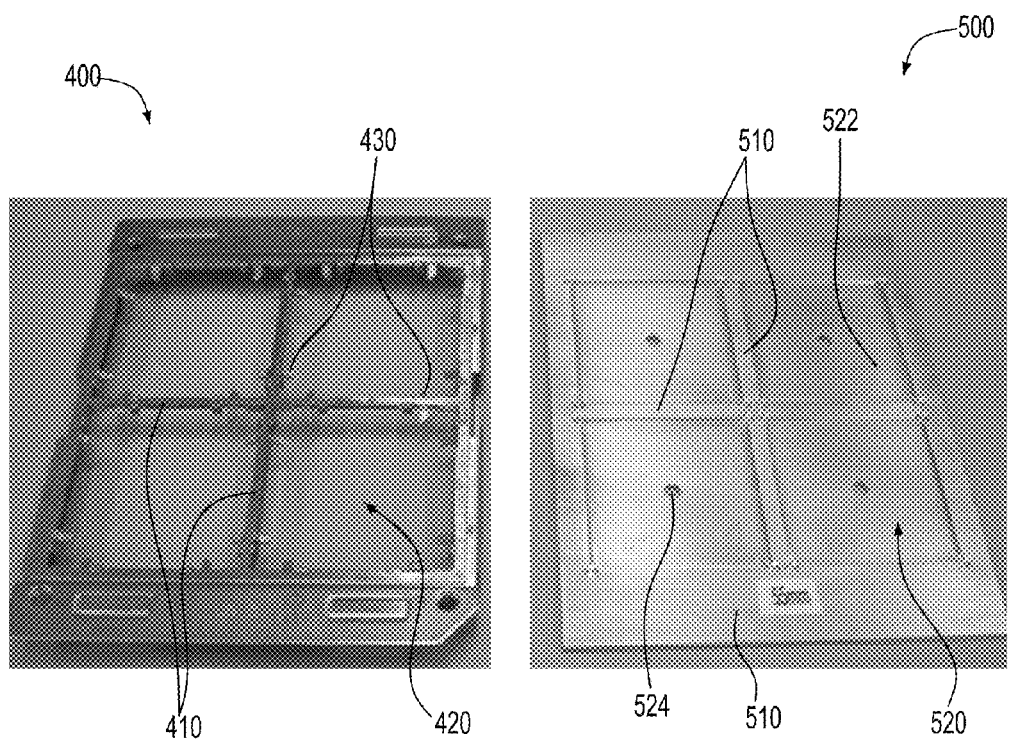
FIG. 4 is an optical photograph of a conventional support fixture for soldering semiconductor components.
FIG. 5A is an optical photograph of a support fixture for soldering semiconductor components according to embodiments.

In embodiments, the chip-substrate assembly is held and transported by a fixture such as a tray that carries the assembly through the various stages of the soldering process. Shown in FIG. 4 is a photograph of a conventional fixture 400 that is configured to carry typically 4-32 chip-substrate assemblies. Fixture 400 includes a frame 410 defining open areas 420. Each open area 420 comprises a plurality of peripheral tabs 430 that are adapted to cooperatively support a chip-substrate assembly within each respective open area 420. Open areas 420 allow a heated gas such as heated nitrogen gas to flow over a large surface area of the assembly. During use, fixture 400 may be mounted onto a conveyor such as a belt or chain.

The contact area of fixture 400 with the belt is designed to be small so that the efficiency of heating the chip-substrate assemblies with gas is maximized. But such a smaller contact area can cause a greater vibration of the chip-substrate assemblies due to the belt vibration and movement. The greater vibrations can be overcome with a viscous and tacky flux, which inhibits or prevents misalignment of the chip from its substrate.

Figure 5B:
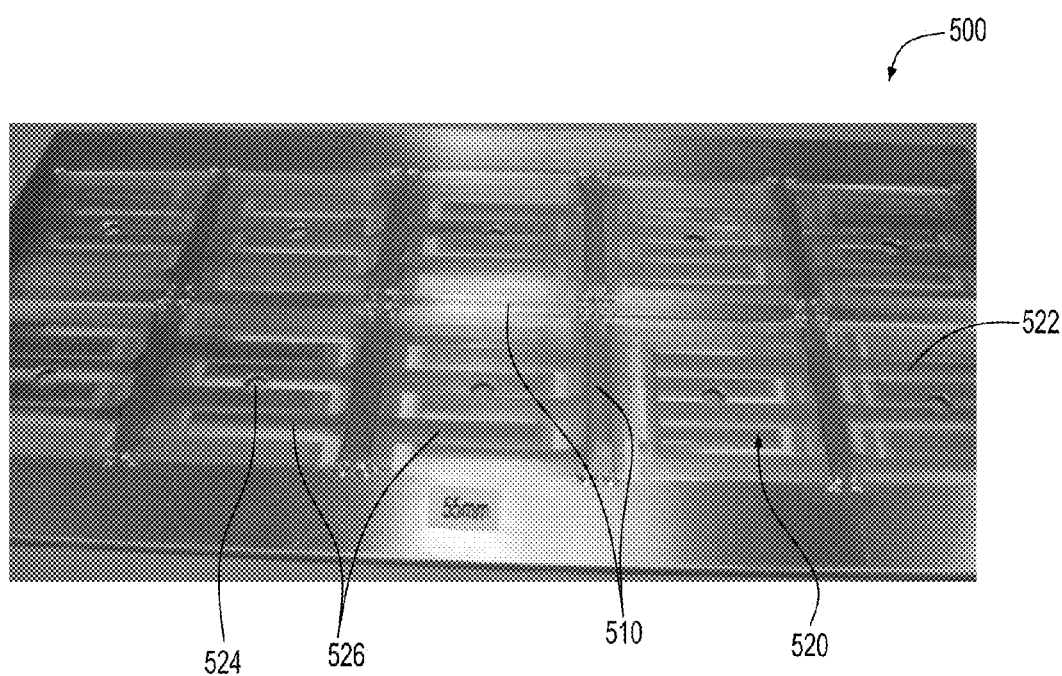
FIG. 5B is an optical photograph of a support fixture for soldering semiconductor components according to further embodiments.

A fixture 500 according to embodiments is shown in FIGS. 5A and 5B. The illustrated fixture 500 is a monolithic tray constructed of a metal such as aluminum. The fixture 500 includes a frame 510 defining substantially closed areas 520. Closed areas 520 are recessed from a top surface of the frame 510 and include a support surface 522 for supporting a chip-substrate assembly. One or more apertures 524 are formed in each support surface 522. Apertures 524 allow a heated gas to circulate over a backside of a chip-substrate assembly that is supported by support surface 522.

Support surface 522 may be a planar surface as depicted in FIG. 5A. Alternatively, support surface 522 may comprise one or more raised ridges 526 as depicted in FIG. 5B. Raised ridges 526 are configured to support a chip-substrate assembly, defining a fluid channel between the support surface and the substrate. Heated gas can flow into the fluid channel via one or more apertures 524.

Fixture 500 includes a planar backside surface opposite to support surface 522. During operation, in various embodiments, the planar backside surface makes contact with a conveyor belt, i.e., over a large fraction of the surface area of the backside surface. For instance, at least 25% (e.g., 25, 30, 50, 75, 80, 85, 90, 95, 97 or 99%, including ranges between any of the foregoing values) of the backside surface makes direct physical contact with a surface of the conveyor belt while less than 20% of the backside contacts a reflow furnace belt in a conventional fixture. The large area contact between the fixture and the conveyor belt dampens vibrations due to motion of the belt that might otherwise cause misalignment between a chip and a substrate prior to solder reflow. Thus the presently-disclosed fixtures enable the use of a less viscous and tacky flux, which can in turn evaporate more easily as a no clean flux.

As used herein, the singular forms "a," "an" and "the" include plural referents unless the context clearly dictates otherwise. Thus, for example, reference to a "solder bump" includes examples having two or more such "solder bumps" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a flux formulation that comprises an activator and a protic solvent include embodiments where a flux formulation consists essentially of an activator and a protic solvent and embodiments where a flux formulation consists of an activator and a protic solvent.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A flux formulation consisting essentially of:
an activator and a single solvent, wherein the activator is a diacid having a boiling, sublimation or decomposition point of from 150° C. to 260° C., wherein the single solvent is a protic solvent and the flux formulation does not contain a second solvent, and wherein the flux formulation is a liquid solution with a tackiness from 20 gram-force to 120 gram-force at 23° C.

2. The flux formulation of claim 1, wherein the protic solvent is selected from the group consisting of alkanediol, alkoxy propanol, and alkoxy ethanol.

3. The flux formulation of claim 1, wherein said flux formulation comprises 5 to 15 percent by weight of the activator and 85 to 95 percent by weight of the protic solvent.

4. The flux formulation of claim 1, wherein the diacid is glutaric acid, and wherein the decomposition point is about 150° C.

5. The flux formulation of claim 1, wherein the single solvent has a boiling point of from 150° C. to 260° C.

6. The flux formulation of claim 1, wherein the flux formulation is free of amine compounds.

7. The flux formulation of claim 1, wherein the flux formulation is devoid of halides and organic resins.

8. A flux formulation consisting essentially of 5 to 15 percent by weight of a diacid and 85 to 95 percent by weight of a single solvent, wherein the flux formulation is a liquid solution with a tackiness from 20 gram-force to 120 gram-force at 23° C., and wherein the single solvent is a protic solvent and the flux formulation does not contain a second solvent.

9. The flux formulation of claim 8, wherein the diacid is glutaric acid, and wherein the decomposition point is about 150° C.

10. The flux formulation of claim 8, wherein the protic solvent is selected from the group consisting of alkanediol, alkoxy propanol, and alkoxy ethanol.

11. The flux formulation of claim 8, wherein the single solvent has a boiling point of from 150° C. to 260° C.

12. The flux formulation of claim 8, wherein the flux formulation is free of amine compounds.

13. The flux formulation of claim 8, wherein the flux formulation is devoid of halides and organic resins.

14. The flux formulation of claim 1, wherein the protic solvent is an alkanediol.

* * * * *